United States Patent
Van Blerkom et al.

(10) Patent No.: US 8,378,284 B2
(45) Date of Patent: Feb. 19, 2013

(54) IMAGING DEVICE

(75) Inventors: Daniel Van Blerkom, Altadena, CA (US); Rami Yassine, Arcadia, CA (US); Jon H Bechtel, Holland, MI (US); Jeremy C Andrus, Zeeland, MI (US)

(73) Assignee: Gentex Corporation, Zeeland, MI (US)

( * ) Notice: Subject to any disclaimer, the term of this patent is extended or adjusted under 35 U.S.C. 154(b) by 941 days.

(21) Appl. No.: 12/360,867

(22) Filed: Jan. 28, 2009

(65) Prior Publication Data

US 2010/0187407 A1    Jul. 29, 2010

(51) Int. Cl.
*H01L 27/00*    (2006.01)

(52) U.S. Cl. ............... 250/208.1; 348/296; 348/297; 348/298; 348/299

(58) Field of Classification Search ........... 250/208.1; 348/297, 298, 299, 296
See application file for complete search history.

(56) References Cited

U.S. PATENT DOCUMENTS

| | | | |
|---|---|---|---|
| 5,288,988 A * | 2/1994 | Hashimoto et al. ........ 250/208.1 |
| 5,748,303 A | 5/1998 | Davis et al. | |
| 5,892,541 A | 4/1999 | Merrill | |
| 6,175,383 B1 * | 1/2001 | Yadid-Pecht et al. ......... 348/302 |
| 6,765,619 B1 | 7/2004 | Deng et al. | |
| 6,831,689 B2 * | 12/2004 | Yadid-Pecht ............... 348/297 |
| 6,963,369 B1 | 11/2005 | Olding | |
| 7,202,463 B1 | 4/2007 | Cox | |
| 7,362,355 B1 | 4/2008 | Yang et al. | |
| 7,468,750 B2 | 12/2008 | Mabuchi et al. | |
| 2003/0001080 A1 * | 1/2003 | Kummaraguntla et al. ......... 250/214.1 |
| 2003/0058346 A1 | 3/2003 | Bechtel et al. | |
| 2004/0021058 A1 * | 2/2004 | Drowley et al. .......... 250/208.1 |
| 2004/0239790 A1 | 12/2004 | Maeda et al. | |
| 2006/0176380 A1 * | 8/2006 | Kobayashi et al. .......... 348/241 |
| 2006/0215882 A1 | 9/2006 | Ando et al. | |
| 2007/0013807 A1 * | 1/2007 | Kanai et al. .................. 348/362 |
| 2007/0257998 A1 | 11/2007 | Inoue | |
| 2008/0001065 A1 * | 1/2008 | Ackland ................... 250/208.1 |
| 2008/0136953 A1 | 6/2008 | Barnea et al. | |
| 2008/0211940 A1 | 9/2008 | Hynecek | |

FOREIGN PATENT DOCUMENTS

| | | |
|---|---|---|
| WO | WO9001844 | 2/1990 |
| WO | WO0024190 | 4/2000 |
| WO | WO01/09717 | 2/2001 |

OTHER PUBLICATIONS

Sung-Hyung Yang & kYOUNG-Rok Cho, High Dynamic Range CMOS Image Sensor with Conditional Reset, IEEE 2002 Custom Integrated Circuits Conf pp. 265-268, Cheongju Chungbuk, Korea.
Patent Cooperation Treaty, Notification of Transmittal of the International Search Report and the Written Opinion of the International Searching Authority, or the Declaration, Dec. 1, 2009, 8 pages.

* cited by examiner

*Primary Examiner* — Georgia Y Epps
*Assistant Examiner* — Kevin Wyatt
(74) *Attorney, Agent, or Firm* — Scott P. Ryan

(57) ABSTRACT

The present invention relates to improved imaging devices having high dynamic range and to monitoring and automatic control systems incorporating the improved imaging devices.

32 Claims, 4 Drawing Sheets

IMAGING DEVICE

CROSS REFERENCE TO RELATED APPLICATIONS

This application is related to U.S. Provisional Patent Applications Ser. Nos. 60/900,588, 60/902,728 and 61/008,762; U.S. patent applications Ser. No. 11/999,623, filed Dec. 6, 2007, Ser. No. 12/082,215, filed Apr. 9, 2008, Ser. No. 12/150,234, filed Apr. 25, 2008, and Ser. No. 12/157,476, filed Jun. 11, 2008; and Taiwanese Patent Application No. 97103404, filed Jan. 30, 2008. The disclosures of each of the above are incorporated in their entireties herein by reference.

BACKGROUND

Imaging devices, including CMOS and CCD versions, are becoming popular in a number of contexts. The present invention provides an improved imaging device having high dynamic range and various apparatuses incorporating these high dynamic range imaging devices.

DETAIL DESCRIPTION

Figure 1:
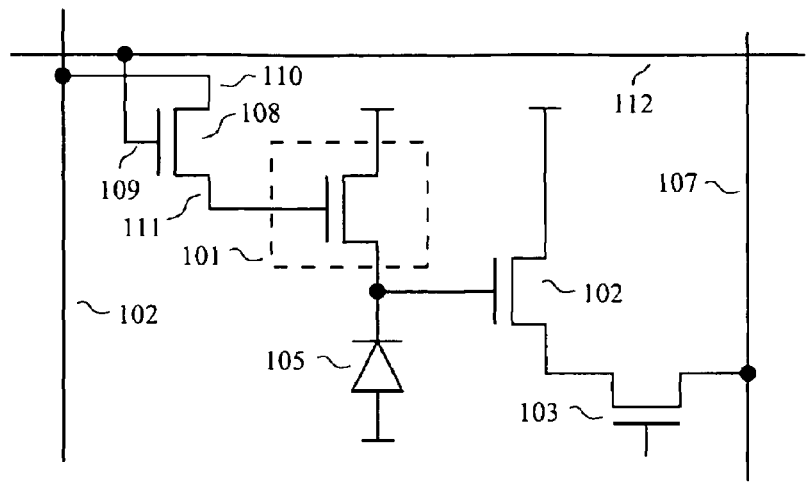
FIG. 1 depicts a prior art pixel structure with a provision for selective reset.
Figure 2:
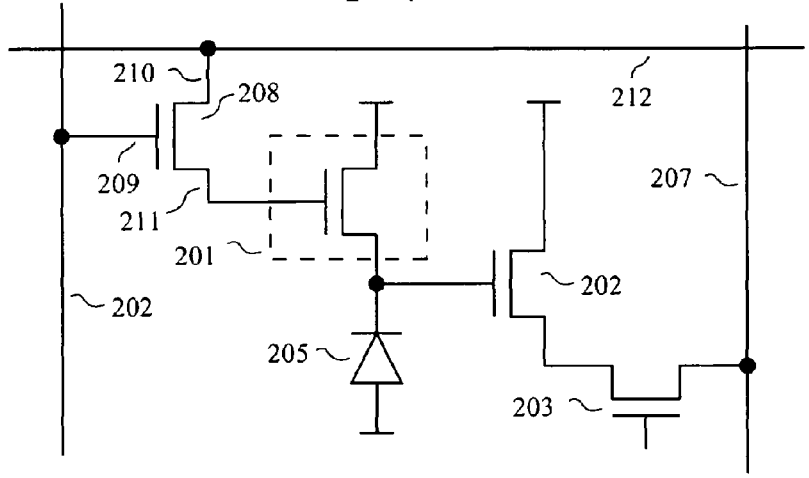
FIG. 2 depicts a pixel structure in accordance with the present invention.
Figure 5:
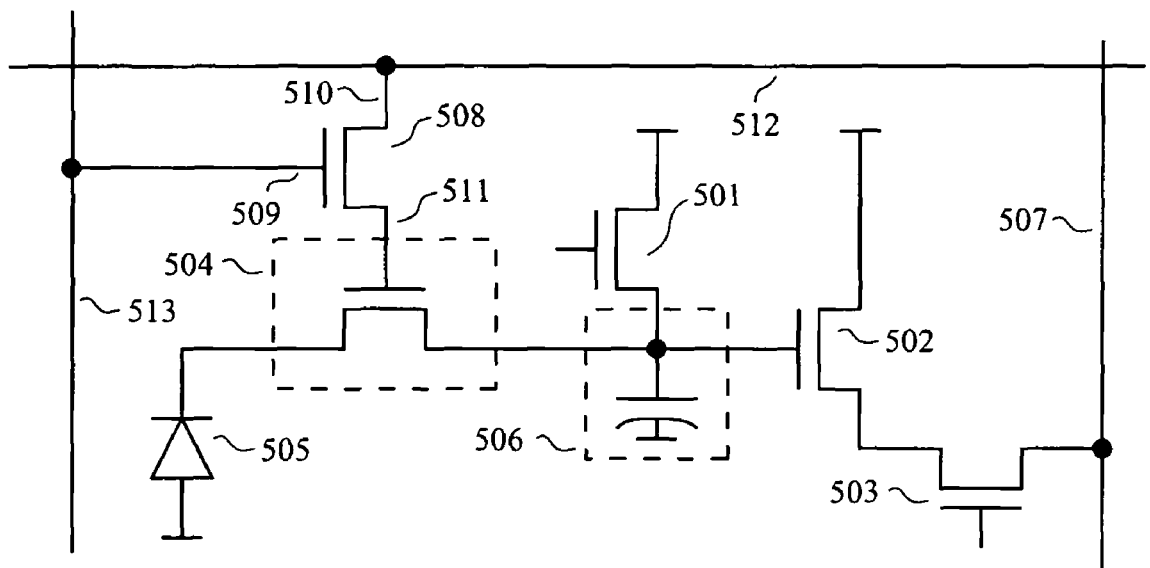
FIG. 5 depicts a pixel based on a four transistor design.

In the related disclosures incorporated by reference above, imaging devices which acquire images over a high dynamic range are disclosed. One embodiment utilizes a 3T based pixel structure as depicted in FIGS. 1 and 2 and a second embodiment utilizes a 4T based pixel structure as depicted in FIG. 5. Each differs from the corresponding pixel in a conventional imaging device in that a logic transistor (Transistor 108 in FIG. 1, 208 in FIG. 2 and 508 in FIG. 5) is included in each of the pixels to permit the integration period during which each pixel responds to incident light to be initiated on a pixel by pixel basis. FIG. 1 depicts a prior art structure and includes features described in U.S. Pat. No. 6,175,383, to Yadid-Pecht et. al. In this specification, pixels fabricated in a CMOS process are described and N-Channel transistors are used in the pixel. The present invention is intended to apply also to pixels which may incorporate P_Channel transistors and it is assumed that one skilled in the art will change polarities to those which are appropriate to assert signal conditions which are prescribed in the specification.

Figure 4:

In FIG. 2 logic transistor 208 is turned on when column reset select line 202 is asserted by pulling it high. To accomplish the reset, row reset select line 212 is also asserted by pulling it high so that both gate 209 and drain 210 of transistor 208 are high to turn on transistor 208 and pull source 211 high. It is preferable to incorporate logic transistors which have a reduced gate threshold voltage and to also provide level shifting circuits and appropriate reference voltage levels so that the voltage levels on the column reset select lines 202 and the row reset select lines 212 may be controlled (preferably independently one from the other) and adjusted to optimize pixel performance. Performance features to be optimized include increase in the dynamic range and reduction in pixel readout noise. Reduced turn on threshold voltages particularly for logic transistor 208 and perhaps also for the reset transistor 201 and selected ones of the remaining transistors in the pixel may lead directly to increasing pixel output voltage range while continuing to meet maximum operating voltage requirements for the circuit components. Further adjustments in bias voltages to provide features such as soft reset are preferred to reduced readout noise. The considerations just given also apply to other embodiments in this specification. Source 211 of transistor 208 is connected to the gate of reset transistor 201, therefore, pulling the point of common connection 211 high turns on reset transistor 201 thereby charging the pixel light sensing photodiode 205 to its reset level. The gate connection 211 to reset transistor 201 may then be discharged to turn off the reset transistor and allow integration to begin. This is accomplished by pulling row reset line 212 low while column reset line 201 is high to reverse the roles of drain 210 and source 211 of logic transistor 208 and thereby pull gate connection 211 to reset transistor 201 low to turn it off and allow the integration period to begin. With transistor 208 turned off, gate 211 of reset transistor 201 is allowed to float raising the possibility that leakage currents may elevate the voltage at the gate and alter the response of photodiode 205. It is, thus, preferable to periodically assert the gate signal 209 of logic transistor 208 while the drain signal 210 is de-asserted to refresh the reset transistor off state gate voltage while integration is in progress. It is preferable that an acceptable maximum time interval between refresh cycles be established for a particular design and application much as is done for refresh cycles for dynamic ram and that the imaging device be configured to refresh the reset gate off voltage at intervals that do not exceed this maximum time interval while integration for a pixel reading is in progress. The reset operation is normally performed during a row read operation for all of the pixels in the row selected for readout. As part of this operation, all of the pixel column reset select lines 202 are asserted (pulled high for N-channel transistors) and only the row reset select line 212 for the row being read is asserted so that for all of the pixels in all of the remaining rows, gate signals of which 209 is representative are asserted (pulled high for N-channel transistors) while drain signals of which 210 is representative are de-asserted (low for N-channel transistors) to perform the desired reset transistor gate voltage refresh operations. It is preferable for each pixel of the selected row to de-assert row reset select signal 210 while column signal 209 is still high to discharge the gate of reset transistor 201 as described above to turn it off at the end of the reset period to begin the initial stage of the next integration periods for pixels of the row that is being read. In a preferred embodiment of the invention, a frame blanking period which may, for example, be two rows in duration is provided between readout of each frame. In at least one embodiment, this time period is used to communicate new settings to the imaging device over the same lines used to receive image data from the imaging device. As an example, for a wide VGA imaging device having a nominal 32 millisecond frame rate, successive rows may be read every 67 microseconds so with the 2 row blanking period, the longest period between successive row read operations is nominally 200 microseconds. FIG. 4 depicts the longest integration period which extends from over a nominal 32 millisecond period from 401 to 403 and refresh intervals of the maximum 200 microsecond duration are represented by lines 402. Buffer transistor 202, readout select transistor 203 and column readout line 207 are provided in general conformance to a traditional 3 transistor based pixel design. As an option, transistors may be shared between pixels and/or additional transistors may be provided to perform functions such as anti-blooming control.

Figure 3:
FIGS. 3 and 4 depict timing diagrams for pixel activity.

FIG. 1 depicts a prior art pixel structure with a provision for selective reset where a logic transistor 108 is provided with a gate connection 109 to row reset enable line 112 and a drain connection 110 to column reset enable line 102. This is the connection specified in U.S. Pat. No. 6,175,383. Other features with labels 1xx correspond generally to similar features with 2xx labels in FIG. 2. FIG. 3 indicates a nominal 32 millisecond integration period extending from 301 to 304 and intermediate lines 302 represent points within this interval at which row reset enable line 112 is asserted thereby asserting the gate signal 109 of logic transistor 108 and providing opportunity to refresh the gate voltage at gate connection 111 of reset transistor 101 to its off state level. A maximum interval of nominally 24 milliseconds between 301 and the first conditional reset processing interval at 302 is 120 times longer than the maximum interval of nominally 200 microseconds between refresh of the reset transistor gate voltage for the example of FIG. 2 for which the gate and drain connections to the respective logic transistors are interchanged. The cited high dynamic range imaging devices may incorporate selective reset circuits configured according to FIG. 1 or FIG. 2 or in other ways, but the configuration in FIG. 2 provides the dramatic advantage as compared to the configuration of FIG. 1 in providing a much shorter maximum interval between successive refresh operations for the reset transistor gate voltage.

FIG. 5 depicts a pixel based on a 4 transistor pixel design which includes logic transistor 508 which is used for selective operation of the transfer gate transistor 504. This configuration may be used as part of the high dynamic range imaging device described in the related disclosures incorporated by reference above. In FIG. 5 the gate 509 of logic transistor 508 is pulled high when column transfer gate operation select line 513 is asserted by pulling it high. To switch the transfer gate to its conductive state, row transfer gate operation select line 512 must also be asserted by pulling it high so that both gate 509 and drain 510 of transistor 508 are high to turn on transistor 508 pulling source 511 high. Source 511 of transistor 508 is connected to the gate of transfer gate transistor 504 so pulling the point of common connection 511 high turns on transfer gate operation transistor 504 thereby transferring charge between light sensing photodiode 505 and floating diffusion 506. The gate connection 511 to transfer gate operation transistor 504 must then be discharged to turn off the transfer gate operation transistor and allow integration to begin. This is accomplished by pulling row transfer gate operation line 512 low while column transfer gate operation line 513 is high to reverse the roles of drain 510 and source 511 of logic transistor 508 and thereby pull gate connection 511 to transfer gate operation transistor 504 low (or maintaining it in a low state) to turn it off and allow the integration period to begin. With transistor 508 turned off, gate 511 of transfer gate operation transistor 504 is allowed to float raising the possibility that leakage currents may elevate the voltage at the gate and alter the response of photodiode 505 or of floating diffusion 506. It is, thus, preferable to assert the gate signal 509 of logic transistor 508 while the drain signal 510 is de-asserted to refresh the off state gate voltage of the transfer gate operation transistor while integration is in progress. It is preferable that an acceptable maximum time interval between refresh cycles be established for a particular design and application much as is done for refresh cycles for dynamic ram and that the imaging device be configured to refresh the transfer gate operation gate off voltage at intervals that do not exceed this maximum time interval while integration for a pixel reading is in progress. The transfer gate transistors are normally switched to their conducting states (turned on) and then switched to their non-conducting states (turned off) during a row read operation for all of the pixels in the row selected row for readout. As part of this operation, all of the pixel column transfer gate operation select lines 513 are asserted (pulled high for N-channel transistors) and only the row transfer gate operation select line 512 for the row being read is asserted so that for all of pixels in all of the remaining rows, the gate signals 509 are asserted (pulled high for N-channel transistors) while drains 510 are de-asserted (low for N-channel transistors) thereby effecting the desired transfer gate transistor gate voltage refresh operation for all pixels in the image array which are not in the row being read. Even for each pixel in the row selected for readout, it is preferable to de-assert row transfer gate operation select signal 510 while column transfer gate operation select signal 509 is still high to discharge the gate of transfer gate transistor 504 as described above to turn it off at the end of the transfer gate operation period to begin the initial integration period for the pre-sample reading for pixels of the row that is being read. In a preferred embodiment of the invention, a frame blanking period which may, for example, be two rows in duration is provided between readout of each frame. In at least one embodiment, this time period is used to communicate new settings to the imaging device over the same lines used to receive image data from the imaging device. As an example, for a wide VGA imaging device having a nominal 32 millisecond frame rate, successive rows may be read every 67 microseconds so with the 2 row blanking period, the longest period between successive row read operations is nominally 200 microseconds. FIG. 4 depicts the longest integration period which extends from over a nominal 32 millisecond period from 401 to 403 and refresh intervals of the maximum 200 microsecond duration are represented by lines 402. Reset transistor 501, floating diffusion 506, buffer transistor 502, readout select transistor 503 and column readout line 507 are provided in general conformance to a traditional 4 transistor based pixel design. As an option, transistors may be shared between pixels and/or additional transistors may be provided to perform functions such as anti-blooming control. In a way which is analogous to the 3 transistor based design, the imaging device remains operational when row and column connections to the logic transistor 508 are interchanged but the longest period between refresh operations for the transfer gate voltage setting are greatly increased. FIGS. 2 and 5 contain logic transistors 208 and 508, respectively, with respective drain connections to row logic function select lines 212, 512 and respective gate connections to column logic function select lines 202, 513

Figure 7:
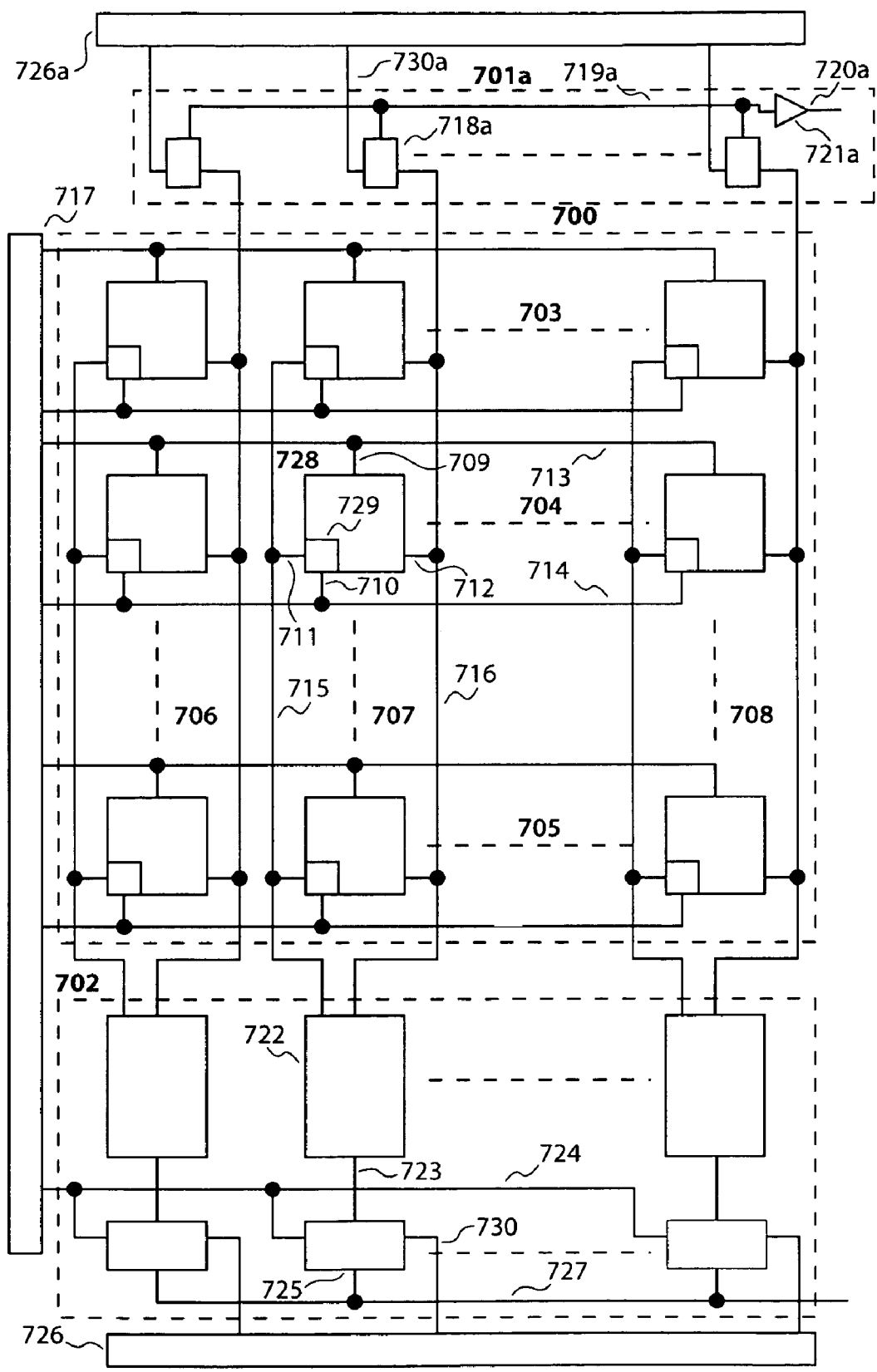
FIG. 7 illustrates an imaging device physical layout in accordance with the present invention.

FIG. 7 is included to illustrate pictorially the layout of circuits in a high dynamic imaging device which utilizes memory provided as part of the imaging device integrated circuit and parallel integration period selection circuits each of which is associated with one or more columns of pixels in the imaging array. FIG. 7 depicts an imaging device with an array 700 of pixels organized in rows (or parallel addressable groups) with first row 703, second row 704, etc. through last row 705. Each pixel of each row is also a member of a column with first column 706, second column 707, etc. through last column 708. Row select circuits 717 generate control signals to single out a selected row or parallel addressable group in order to perform prescribed tasks on pixels of the selected row or parallel addressable group. Most operations such as initiation of integration periods, readout of pixel values, etc. are preferably performed a row or parallel addressable group at a time. Optionally, during the row processing time, pixel values read from a row are sequentially digitized and their values communicated to an output device during a row sequencing period and column select circuits 726 and 726a are used to select the active column for the sequential pixel conversion and output operation. Pixel data for the pixel in a selected row or parallel addressable group is read out on parallel column readout lines of which 716 is one and registered in readout holding circuits 718a in block 701a and in response to selection by column select circuit 726 are sequentially gated to bus 719a to be amplified and digitized by circuit 721a and output at 720a. What has been described so far is typically included in CMOS imaging devices that employ what is known as a rolling shutter image acquisition and readout sequence. It should be noted here that use of pixel by pixel sequential readout is not necessary to practice this invention.

Pixel level selection circuits 729 with row input 710 and column input 711 and column selection lines 715 are added to the imaging array 700 as part of the integration period selection circuit. Parallelized column task execution units 722 and pixel integration period memory circuits 725 are provided as part of column logic block 702. These added circuits are provided as part of this invention to implement the multiple selectable integration periods which are preferably selectable independently for each pixel, and for each image acquired as detailed elsewhere herein.

For the 3T based pixel design, pixel 728 corresponds to the pixel structure of FIG. 1 or 2, with line 714 corresponding to row reset select lines 112 or 212 and line 715 corresponding to column reset select lines 102 or 202.

For the 4T based pixel design, pixel 728 corresponds to the pixel structure of FIG. 5, with line 714 corresponding to row transfer gate operation select line 512 and line 715 corresponding to column transfer gate operation select select line 513. Additional details of operation are included in the cited prior art.

Figure 6:
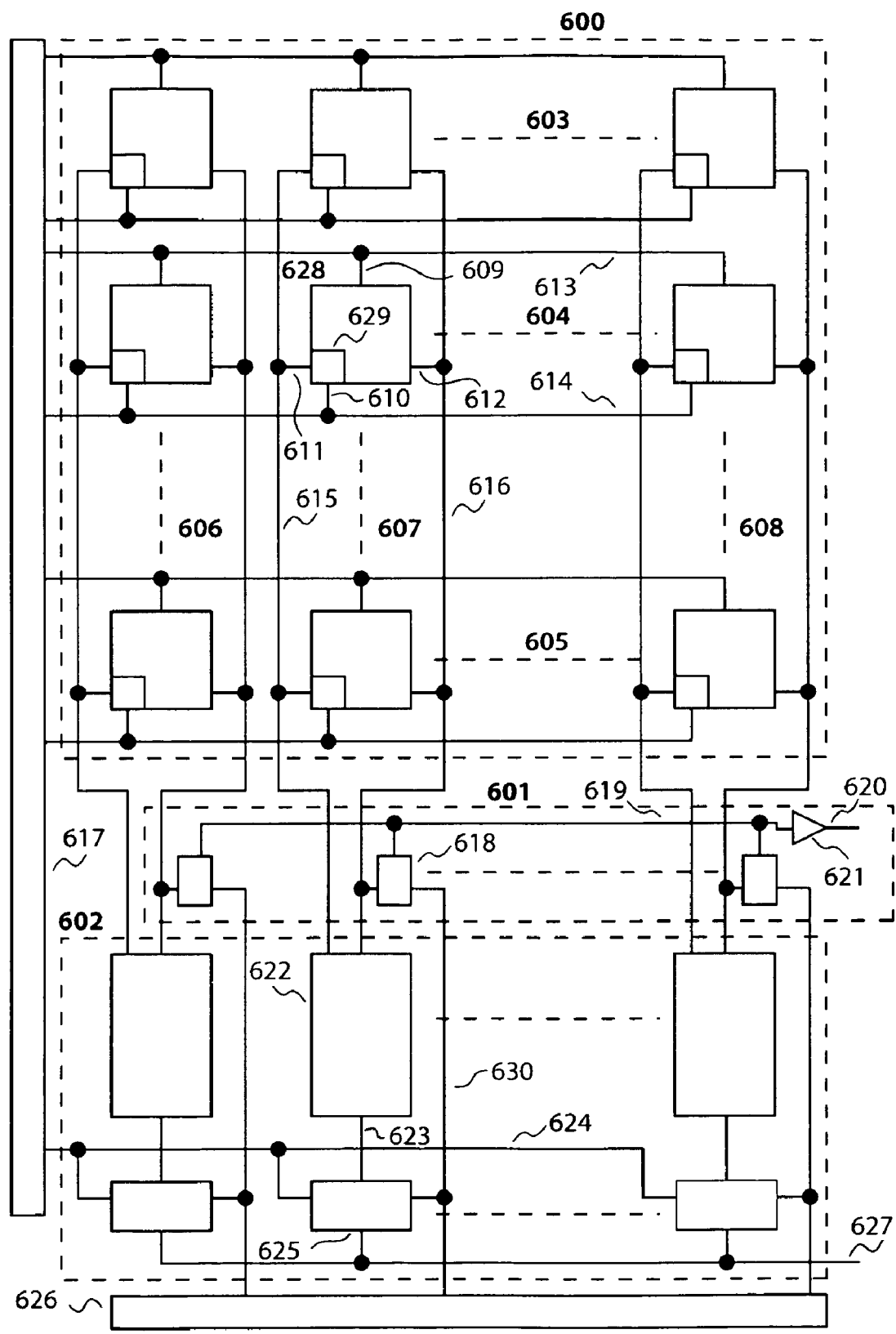
FIG. 6 illustrates a prior art imaging device physical layout.

FIG. 6 represents prior art and includes circuits which are similar to those provided in FIG. 7. For clarity and convenience, components in FIG. 6 which have similar functionality to corresponding components if FIG. 7 are given a 6xy designation to correlate with the 7xy designation of FIG. 7. In both FIG. 6 and FIG. 7, there are two blocks of circuitry 601 and 602 of FIG. 6 and 701a and 702 of FIG. 7 which each include logic associated with column readout and control lines in the respective pixel arrays 600 and 700. In FIG. 6, column select circuit 626 provides a column by column indication which is used to sequence digitization and output of individual pixel values for the row of pixels which are sampled by circuits 618 as a selected row of pixels is read and then sequentially processed and digitized by circuit 621 and output at 620. An indication of the integration period used for each pixel is read from the memory location associated with the pixel in column associated memory block 625 and output on bus 627 preferably so that it can be read synchronously with the associated digitized pixel value output on bus 620. A selection output from column select circuit 626 on line 630 is referenced by both the pixel readout and digitization circuit and by the pixel integration memory to sequence and synchronize these events. Circuits 622 and associated memory 625 function to make determinations of integration periods to choose for individual pixels in the associated column and record data on these selections in memory 625. This selection sequence occurs during the same time interval in which circuit 601 and in particular sample and hold element 618 is engaged in the sample and hold, digitization, and pixel value output sequence. Interaction between the two circuits, particularly of control signals from block 602 with the sample and hold capacitors of block 601 caused shaded vertical stripes in the image. FIG. 7 indicates layout changes which minimize and even eliminate this artifact. In FIG. 7 the circuit similar to block 601 in FIG. 6 is depicted as block 701a. This block is associated primarily with sampling and digitization of pixel values in a row being read and is separated from the block the block similar to 602, depicted as block 701 in FIG. 7, which is primarily associated with selection and recording of the integration period for each pixel. The preferred way to accomplish the separation is to place circuits in the integration period selection associated block 702 on one side of the imaging array placing them so that they may be connected with associated column lines in the array and placing circuits in the pixel value readout associated block 701a on the opposite side of the imaging array placing them so that they may be connected with associated column lines in the array. Column select circuits originally in shared block 626 are preferably replaced by column select block 726a associated with readout circuit 701a and column select block 726 associated with the integration period selection circuits 702. One function of blocks 726 and 726a is to select and synchronize output of the digitized pixel readings on 721a with an indication of the integration period used for the pixel. This indication of the integration period is output on line 727. One way to accomplish this is to provide circuits 726 and 726a which are substantially identical so that selection signals at 730 and 730a are substantially the same. Depending on details of the implementation, even correlation in circuit delays and timing may be factors which need control in the design.

It should be understood that the above detail description is provided for enabling one of ordinary skill in the art to make and use the invention as recited in the appending claims. In know way should this description be interpreted as limiting the scope of the invention to any given embodiment, therefore, the appending claims are intended to include all equivalent structure and equivalent function within the respective scope.

What is claimed is:

1. An imaging device, comprising:
    an array of pixels, said pixels are based on a 4T pixel structure;
    each of said pixels further comprising:
        a selective transfer gate operation logic function transistor connected to a transfer gate, said selective transfer gate operation logic comprising:
            a drain connected to a row logic function select line configured to refresh a gate signal of a connected transistor; and
            a gate connected to a column logic function select line.

2. An imaging device as in claim 1 said selective transfer gate operation logic function transistor responds to concurrence of a signal which enables said pixel and a signal to select an integration period for said pixel.

3. An imaging device as in claim 1 wherein a selective transfer gate operation logic function transistor is located on a common substrate proximate each pixel within said array of pixels.

4. An imaging device as in claim 1 wherein an integration period for each pixel within said array of pixels is dynamically determined within a corresponding image acquisition sequence.

5. An imaging device as in claim 1 wherein a start of an integration period for each pixel within said array of pixels is dynamically determined within a corresponding image acquisition sequence.

6. An imaging devices as in claim 1 configured to operate greater than 25 frames/second.

7. An imaging devices as in claim 1 comprising greater than 130 dB dynamic range.

8. An imaging device, comprising:
at least a substantial subset of columns of pixels, each said column of pixels in said subset comprising:
a column circuit configured to receive an input from a selected pixel from an associated column; and
each of said pixels further comprising:
a selective transfer gate operation logic function transistor connected to a transfer gate, said selective transfer gate operation logic comprising:
a drain connected to a row logic function select line configured to refresh a gate signal of a connected transistor; and
a gate connected to a column logic function select line.

9. An imaging device as in claim 8 wherein all columns comprise a column circuit.

10. An imaging device as in claim 8 wherein said input to said column circuit from said selected pixel is an analog input.

11. An imaging device as in claim 10 wherein said analog input is compared to an analog threshold value within said column circuit.

12. An imaging device as in claim 11, each said column circuit comprising a memory associated with said selected pixel to record an indication of said selected integration period for said selected pixel.

13. An imaging device as in claim 8, wherein settings in said memory are used at least in part, to select an integration period for said selected pixel.

14. An imaging device as in claim 13 wherein the result of said comparison is used in part to select an integration period for said selected pixel.

15. An imaging device as in claim 8 wherein said column circuit is configured to receive an input from a selected pixel in an associated column, to select an integration period for said selected pixel and to output a signal to said selected pixel to initiate said selected integration period within a single task.

16. An imaging device as in claim 8 wherein conditional selection and initiation of integration periods occurs substantially in parallel for multiple columns, each column comprising an associated column circuit.

17. An imaging device as in claim 8 wherein a first transistor within each pixel is configured to receive a first signal indicating when the pixel within said column is currently selected and a second signal from an associated column circuit indicating a selected integration period for said selected pixel, wherein said transistor outputs a signal which at least in part controls initiation of said selected integration period for said selected pixel.

18. An imaging device as in claim 17 wherein said first transistor is coupled to a transfer gate transistor which initiates transfer of charge from a light induced charge accumulating site within said selected pixel to a charge storage site within said selected pixel, this action being used at least in part to initiate a selectable integration period chosen for the pixel.

19. An imaging device as in claim 17 wherein said first transistor is coupled to a reset transistor which resets said selected pixel to perform tasks which include initiation of a selectable integration period for said selected pixel.

20. An imaging device as in claim 8 each said pixel comprising an anti-blooming control circuit.

21. An imaging device as in claim 8 wherein pixel structure is based on a 3T pixel design.

22. An imaging device as in claim 8 wherein pixel structure is based on a 4T pixel design.

23. An imaging device as in claim 8 wherein digitized pixel readout is performed using at least one circuit at least partially distinct from a column circuit associated with selected column.

24. An imaging device as in claim 23 wherein pixel values are digitized during time periods that at least partially overlap time periods during which integration periods are chosen and initiated for pixels.

25. An imaging device as in claim 8 wherein pixel values are digitized only once per image acquisition sequence.

26. An imaging device as in claim 8 wherein selected integration periods are selected from a discrete set of available integration periods.

27. An imaging device as in claim 26 wherein available integration periods end at the same time.

28. An imaging device as in claim 27 wherein a value indicative of the light received by a pixel is based on the digitized pixel value and the integration period chosen for the pixel.

29. An imaging device as in claim 8 wherein values indicative of the light received by pixels is output in a conventional order as part of a rasterized scan sequence.

30. An imaging device as in claim 29 wherein integration periods available for pixels start at different times.

31. An imaging devices as in claim 8 configured to operate greater than 25 frames/second.

32. An imaging devices as in claim 8 comprising greater than 130 dB dynamic range.

* * * * *

UNITED STATES PATENT AND TRADEMARK OFFICE
CERTIFICATE OF CORRECTION

PATENT NO. : 8,378,284 B2  
APPLICATION NO. : 12/360867  
DATED : February 19, 2013  
INVENTOR(S) : Daniel Van Blerkom et al.

Page 1 of 1

It is certified that error appears in the above-identified patent and that said Letters Patent is hereby corrected as shown below:

In the Claims:

Column 7
Claim 12, line 26, "11, each" should be --8, each--.
Claim 13, line 30, "8, wherein" should be --12, wherein--.
Claim 14, line 33, "13 wherein" should be --11, wherein--.

Signed and Sealed this
Sixteenth Day of July, 2013

Teresa Stanek Rea
*Acting Director of the United States Patent and Trademark Office*